United States Patent
Lee

(10) Patent No.: US 7,327,187 B2
(45) Date of Patent: Feb. 5, 2008

(54) METHOD, CIRCUIT AND POWER AMPLIFIER FOR DETECTING A FAULT, AND METHOD OF PROTECTING A CIRCUIT IN A POWER AMPLIFIER FROM A FAULT OCCURRENCE

(75) Inventor: Jae-Wook Lee, Seoul (KR)

(73) Assignee: Samsung Electronics Co., Ltd. (KR)

( * ) Notice: Subject to any disclaimer, the term of this patent is extended or adjusted under 35 U.S.C. 154(b) by 486 days.

(21) Appl. No.: 10/979,484

(22) Filed: Nov. 2, 2004

(65) Prior Publication Data

US 2005/0093622 A1    May 5, 2005

(30) Foreign Application Priority Data

Nov. 3, 2003    (KR) .................. 10-2003-0077280

(51) Int. Cl.
*H03F 3/217*    (2006.01)
*H03F 1/52*    (2006.01)

(52) U.S. Cl. ................... 330/10; 330/251; 330/298; 330/207 A; 330/207 P

(58) Field of Classification Search .............. 330/10, 330/251, 298, 207 A, 207 P
See application file for complete search history.

(56) References Cited

U.S. PATENT DOCUMENTS 4,724,396 A *  2/1988  Taylor et al. ............... 330/10
6,469,575 B1  10/2002  Oki et al. .................. 330/10
6,498,531 B1  12/2002  Ulrick et al. ............... 330/10
7,078,964 B2 *  7/2006  Risbo et al. ................ 330/10
7,113,030 B2 *  9/2006  Yang et al. ................. 330/10
2005/0083116 A1 *  4/2005  Risbo et al. ................ 330/10

FOREIGN PATENT DOCUMENTS

| JP | 00-165154 | 6/2000 |
| JP | 03-51724 | 2/2003 |
| KR | 01-95928 | 11/2001 |
| KR | 2003-0024693 | 3/2003 |
| KR | 2003-0031154 | 4/2003 |

\* cited by examiner

*Primary Examiner*—Evan Pert
(74) *Attorney, Agent, or Firm*—F. Chau & Assoc. LLC

(57) ABSTRACT

In a method of detecting a fault in a class D amplifier, an amplifier output signal is generated based on inverting a pulse width modulation signal corresponding to received audio data. The amplifier output signal is low pass filtered and hysteretically filtered (Schmitt Triggered). The filtered amplifier output signal is sampled (latched) using the pulse width modulation signal as a sampling (latch) clock signal, to generate a first comparison signal. The pulse width modulation signal is sampled (latched) using the filtered amplifier output signal as a sampling (latch) clock signal, to generate a second comparison signal. A fault detection signal for detecting the fault is generated by comparing the first and second comparison signals. Since the first pulse width modulation signal and the filtered amplifier output signal are robustly compared, a fault occurrence may be directly and reliably detected.

40 Claims, 16 Drawing Sheets

METHOD, CIRCUIT AND POWER AMPLIFIER FOR DETECTING A FAULT, AND METHOD OF PROTECTING A CIRCUIT IN A POWER AMPLIFIER FROM A FAULT OCCURRENCE

CROSS REFERENCE TO RELATED APPLICATION

This application claims priority under 35 USC § 119 to Korean Patent Application No. 2003-77280, filed on Nov. 3, 2003, the contents of which are herein incorporated by reference in their entirety for all purposes.

1. Field of the Invention

The present invention relates to a method, a circuit and a power amplifier able to detect a fault, and a method of protecting a class D power amplifier, upon the occurrence of a fault.

2. Discussion of Related Art

Class D power amplifiers are used in DVD receivers, AV receivers, hearing aids, cellphones, plasma displays, aftermarket autosound, OEM autosound, personal computers, PDAs, CD headphones, boom boxes, and professional audio equipment. There is a need for a fault detection circuit, capable of directly detecting a fault in a class D power amp. A fault detection circuit prevents a circuit from being destroyed, by detecting a fault when the fault occurs. A conventional (not class D) power amplifier uses an analog-type amp. In addition, an output signal of the conventional power amplifier is an analog signal. Therefore, the conventional power amplifier detects the occurrence of the fault by directly comparing the analog output signal with an original signal. In addition, the conventional power amplifier detects the occurrence of the fault by monitoring an internal current flowing therethrough. In a class D power amplifier, however, the audio source and the output signal are digital signals. Therefore, the audio source and the output signal of the class D power amplifier cannot be directly compared with each other. Thus, the class D power amplifier cannot use a conventional method of detecting a fault in the conventional power amp. Therefore, there is a need for a fault detection circuit, capable of directly detecting a fault in class D power amplifier.

SUMMARY OF THE INVENTION

An exemplary embodiment of the present invention provides a method of detecting a fault in a class D (digital) device. In the method, a pulse width modulation signal corresponding to digital data is received. An amplifier output signal is generated based on the pulse width modulation signal. A first comparison signal having information of a (possible) fault occurrence is generated based on a first comparison between the pulse width modulation signal and the (filtered) amplifier output signal. A second comparison signal having information of a (possible) fault occurrence is generated based on a second (simultaneous) comparison between the pulse width modulation signal and the (filtered) amplifier output signal. A fault detection signal for detecting the fault is generated based on a comparison of the first and second comparison signals.

Another exemplary embodiment of the present invention provides a method of detecting a fault of a class D amplifier. The method includes: generating a pulse width modulation signal corresponding to received digital data; generating an output signal based upon the pulse width modulation signal; filtering the output signal to produce a filtered output signal; generating a first comparison signal based on a first comparison between the pulse width modulation signal and the filtered output signal; generating a second comparison signal based on a second comparison between the pulse width modulation signal and the filtered output signal; and generating a fault detection signal, for indicating the fault, based on a comparison between the first comparison signal.

In this method, generating a first comparison signal may include: sampling and holding (latching) the filtered output signal using the pulse width modulation signal as a first sampling clock signal (of a D-latch, D flip-flop), to generate the first comparison signal; and generating a second comparison signal includes: sampling and holding (latching) the pulse width modulation signal using the amplifier output signal as a second sampling clock signal, to generate the second comparison signal. The first and second comparison signals e.g., latched samples of the filtered output signal (digital output) and of the pulse width modulation signal (digital input), are compared with each other to determine whether a fault is occurring.

In this method, the pulse width modulation signal is applied to a (switch-controlling) gate of a P-type output FET transistor (an first output switch) of the class D amplifier. Meanwhile the pulse width modulation signal is inverted and the inverted (complementary) pulse width modulation signal is applied to a (switch-controlling) gate of an N-type output FET transistor (a second output switch) of the class D amplifier. The output signal, outputted to a load (e.g., a speaker) via the output FET transistors of the class D amplifier, is fed back to a circuit protection unit including a fault occurrence determination unit (where the output signal is filtered, latched, and then compared with the latched pulse width modulation signal). An abnormal non-variation of the output signal (relative to the received pulse width modulation signal) is detected based on a first comparison between the (latched) pulse width modulation signal and the (filtered, latched) output signal. An abnormal state detection signal is generated when an abnormal variation state is detected based on a second comparison between the (latched) pulse width modulation signal and the (filtered, latched) output signal.

Further, another exemplary embodiment of the present invention provides a method of protecting a power amplifier circuit. In the method, an amplifier output signal having information of a fault is generated based on a pulse width modulation signal corresponding to audio data. A fault detection signal for detecting the fault is generated based on a comparison between the pulse width modulation signal and the amplifier output signal. A protection signal for protecting a circuit is generated based on the fault detection signal.

Still another exemplary embodiment of the present invention provides a method of protecting a power amplifier circuit. In the method, an amplifier output signal having information of the fault is generated based on a first pulse width modulation signal and a second pulse width modulation signal having the pulse width corresponding to an audio data. A fault detection signal for detecting the fault is generated based on a comparison between the first pulse width modulation signal and the amplifier output signal. The first pulse width modulation signal for protecting a circuit is generated based on the fault detection signal. The second pulse width modulation signal for protecting the circuit is generated based on the fault detection signal.

Still another exemplary embodiment of the present invention provides a circuit for detecting an abnormal state in a class D power amplifier. The circuit may include a first input terminal, a second input terminal, a first discriminator, a second discriminator and a detection signal generator.

The first input terminal receives a pulse width modulation signal, which is applied to a gate of an output FET transistor of the class D power amplifier. The second input terminal receives an output signal outputted to a load via a drain of the output FET transistor. The first discriminator compares the pulse width modulation signal with the output signal to discriminate an abnormal non-variation state of the output signal. The second discriminator compares the pulse width modulation signal with the output signal to discriminate an abnormal variation state of the output signal. The detection signal-generator generates an abnormal state detection signal when the abnormal non-variation state or abnormal variation state is discriminated.

Still another exemplary embodiment of the present invention provides a circuit for detecting a fault comprising: a fault discriminator configured to generate a filtered output signal by filtering an output signal; and a fault detector configured to generate a fault detection signal by comparing a pulse width modulation signal corresponding to digital data with the filtered output signal. The fault discriminator may be configured to generate a fault discrimination signal for discriminating a fault based on (filtering) an amplifier output signal, and a fault detector configured to compare a pulse width modulation signal corresponding to digital data with the fault discrimination signal to generate a fault detection signal for detecting the fault. The fault detector may include: a first comparator configured to generate a first comparison signal having information about a fault occurrence by sampling the fault discrimination signal using a first pulse width modulation signal as a first sampling clock signal; and a second comparator configured to generate a second comparison signal having information about the fault occurrence by sampling the first pulse width modulation signal using the fault discrimination signal as a second sampling clock signal; and a fault occurrence determination unit configured to generate the fault detection signal based on comparing the first and second comparison signals.

Still another exemplary embodiment of the present invention provides a class D amplifier. The class D amplifier may include a first output transistor, a second output transistor, a circuit for detecting an abnormal state, and a pulse width modulation signal generator.

The first output transistor is connected between a first power voltage and an output terminal, and switched by a first pulse width modulation. The second output transistor is connected between the output terminal and a second power voltage, and switched by a second pulse width modulation. The circuit for detecting an abnormal state receives the first pulse width modulation signal and an output signal of the output terminal, and detects an abnormal state in the output signal of the output terminal to generate an abnormal state detection signal. The pulse width modulation signal generator receives a digital data to generate the first and second pulse width modulation signals in a normal mode, and turns off the first and second output transistors when the abnormal state detection signal is provided from the circuit for detecting an abnormal state.

Still another exemplary embodiment of the present invention provides a power amplifier for detecting a fault. The power amplifier may include a signal generator, an amplifier output unit, and a circuit protection unit.

The signal generator receives an audio signal having audio data and a fault detection signal to modulate the audio signal, thereby generating a pulse width modulation signal corresponding to the audio data, and generates a protection signal for protecting a circuit in responsive to the fault detection signal. The amplifier output unit generates an amplifier output signal for driving a speaker by inverting the pulse width modulation signal. The circuit protection unit compares the pulse width modulation signal with the amplifier output signal to generate the fault detection signal for detecting the fault.

Still another exemplary embodiment of the present invention provides a power amplifier for detecting a fault.

The power amplifier may include a signal generator, an amplifier output unit and a circuit protection unit.

The signal generator modulates an audio signal having audio data to generate a first pulse width modulation signal and a second pulse width modulation signal, and generates a first protection signal and a second protection signal for protecting a circuit based on a fault detection signal. The amplifier output unit generates an amplifier output signal for driving a speaker using the first and second pulse width modulation signals. The circuit protection unit compares the amplifier output signal with the first pulse width modulation signal to generate the fault detection signal for detecting a fault.

BRIEF DESCRIPTION OF THE DRAWINGS

The features of the present invention will become understood by those having ordinary skill in the art by describing, in detail, exemplary embodiments thereof with reference to the attached drawings, wherein like elements are represented by like reference numerals.

DETAILED DESCRIPTION OF THE EXEMPLARY EMBODIMENTS

Figure 1:
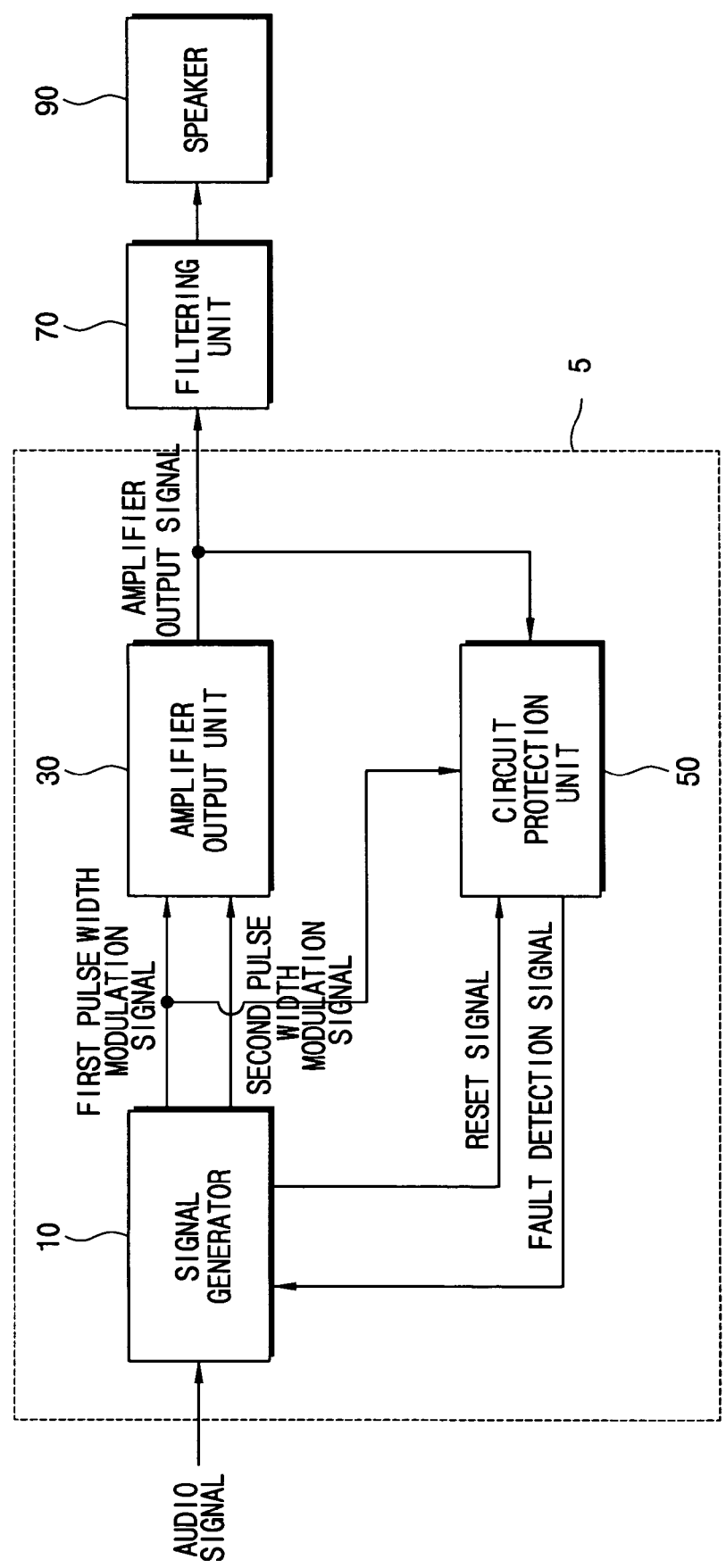
FIG. 1 is a functional block diagram illustrating a class-D power amplifier having fault detection and circuit protection according to an exemplary embodiment of the present invention.

FIG. 1 is a block diagram illustrating a class-D power amplifier having fault detection and circuit protection according to an exemplary embodiment of the present invention. Referring to FIG. 1, the power amplifier 5 includes a signal generator 10, an amplifier output unit 30 and a circuit protection unit 50. When a fault, for example a short circuit, occurs in a circuit of the power amp 5 (e.g., between an output node of the power amplifier 5 and ground), the fault detection and circuit protection circuits of power amplifier 5 of the present invention may detect the fault and protect the amplifier 5.

The signal generator 10 receives an audio signal having audio data as in the related art and additionally receives a fault detection signal having information about (e.g., indicating) an occurrence of a fault. Additionally, the signal generator 10 generates a first pulse width modulation (PWM) signal and a second pulse width modulation (PWM) signal used in accordance with an embodiment of the invention for protecting the amplifier 5 based on the received fault detection signal and the audio signal.

The audio signal may correspond to an analog (e.g., music) signal or a digital (e.g. data) signal. The audio signal according to an exemplary embodiment of the present invention is a digital signal.

The first and second pulse width modulation signals normally correspond to the received audio signal. In particular, the pulse widths of the first and second pulse width modulation signals vary with the audio signal. Hereinafter, it is assumed that the first pulse width modulation signal and the second pulse width modulation signal are same signals during normal operation of the amplifier. However, when the fault occurs in the circuit of the power amp 5, the circuit can be protected using the first and second pulse width modulation signals.

The signal generator 10 generates a reset signal after a fault has occurred and has ceased. The reset signal is generated after a predetermined time has passed from the occurrence (detection) of the fault. When the reset signal is generated, the power amplifier 5 again operates normally.

The amplifier output unit 30 receives the first pulse width modulation signal and the second pulse width modulation signal. In addition, the amplifier output unit 30 generates an amplifier output signal as an amplified output of the power amplifier 5 based on the first and second pulse width modulation signals. According to an exemplary embodiment of the present invention, the amplifier output unit 30 inverts the first pulse width modulation signal (or the second pulse width modulation signal), thereby generating the amplifier output signal. The amplifier output signal is a digital signal.

The amplifier output signal is transmitted to a speaker 90 via a filtering unit 70, thereby reproducing an amplified (analogue) audio sound corresponding to the audio signal. The filtering unit 70 may be a low-pass filter. Thus, the filtering unit 70 eliminates noise in the amplifier output signal.

The circuit protection unit 50 generates the fault detection signal having information about (e.g., indicating) the occurrence of the fault based on the first pulse width modulation signal (or the second pulse width modulation signal) and the amplifier output signal. The circuit of the power amplifier 5 is protected using the fault detection signal.

The circuit protection unit 50 receives the reset signal. The reset signal is generated after a predetermined time following the detection of a fault after the fault has occurred.

The power amplifier 5 of the present invention may be protected using the fault detection signal generated based on the first pulse width modulation signal and the amplifier output signal.

Figure 2:
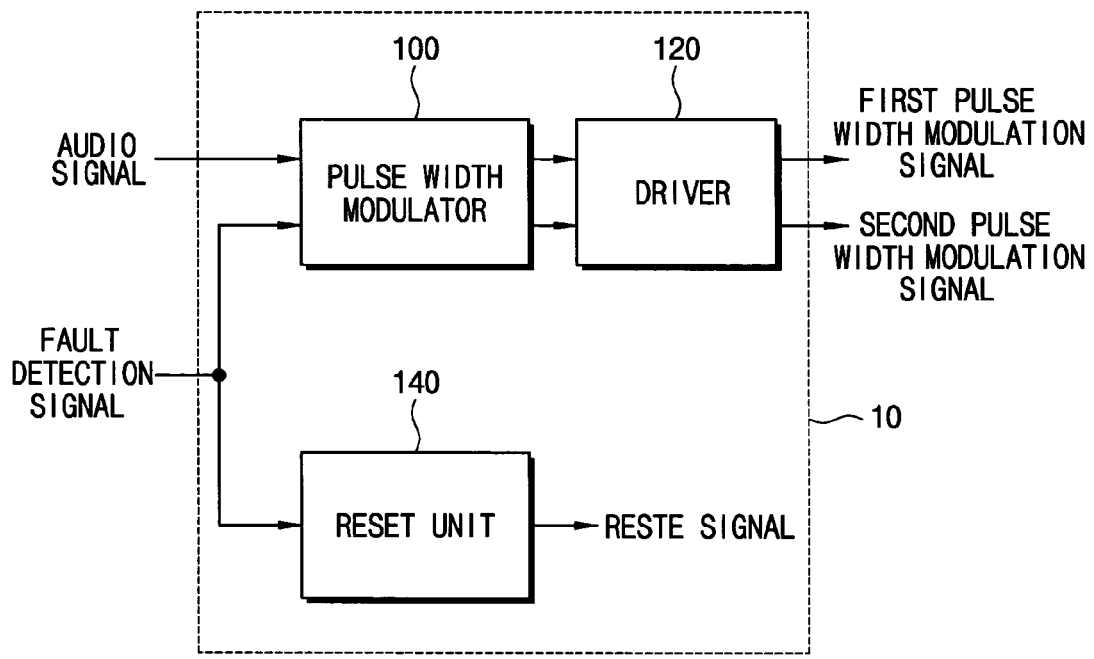
FIG. 2 is a block diagram illustrating a signal generator in the amplifier of FIG. 1.

FIG. 2 is a block diagram illustrating a signal generator (e.g., in power amplifier 5 of FIG. 1) according to an exemplary embodiment of the present invention.

Referring to FIG. 2, the signal generator 10 includes a pulse width modulator 100, a driver 120 and a reset unit 140.

The pulse width modulator 100 modulates the audio signal to generate the first pulse width modulation signal and the second pulse width modulation signal. The pulse width modulator 100 of the present invention modulates the pulse width (of the series of pulses transmitted within the first pulse width modulation signal and in the second pulse width modulation signal), based on the audio data included to the audio signal, to generate the first pulse width modulation signal and the second pulse width modulation signal.

The first and second pulse width modulation signals are input to the amplifier output unit 30 via the driver 120.

When an active fault detection signal is received, the pulse width modulator 100 generates the first pulse width modulation signal having a high logic level and the second pulse width modulation signal having a low logic level. Consequently, the amplifier output unit 30 is turned "off".

The reset unit 140 generates the reset signal after a predetermined time has passed after the fault has been detected.

Figure 3:
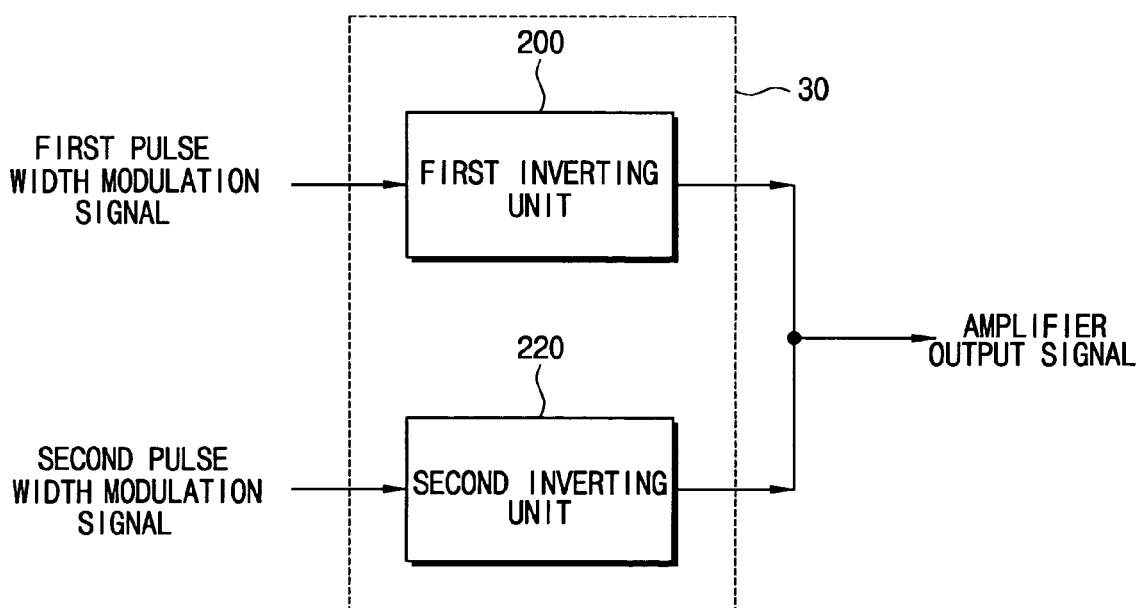
FIG. 3 is a block diagram illustrating an amplifier output unit in the amplifier of FIG. 1.

FIG. 3 is a block diagram illustrating an amplifier output unit 30 (e.g., in the power amplifier 5 of FIG. 1) according to an exemplary embodiment of the present invention.

Referring to FIG. 3, the amplifier output unit 30 includes a first inverting unit 200 and a second inverting unit 220.

The first inverting unit 200 inverts the first pulse width modulation signal to generate a first component of the amplifier output signal. The second inverting unit 220 inverts the second pulse width modulation signal to generate a second component of the amplifier output signal. During normal operation of the power amplifier 5, the first component of the amplifier output signal and the second component of the amplifier output signal may be the same.

According to an exemplary embodiment of the present invention, the amplifier output unit 30 normally operates only a selected one of the first and second inverting units 200 and 220.

Figure 4:
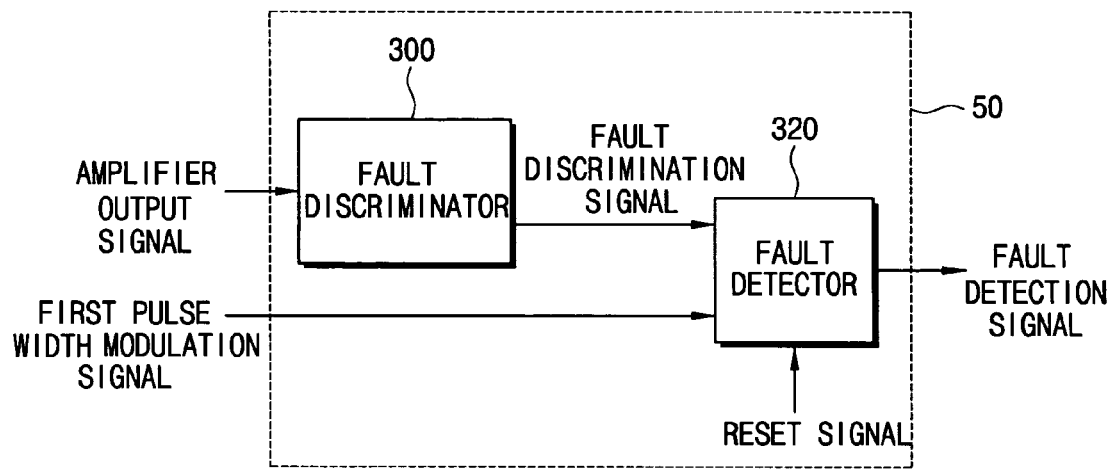
FIG. 4 is a block diagram illustrating a circuit protection unit according to an exemplary embodiment of the present invention.

FIG. 4 is a block diagram illustrating a circuit protection unit (e.g., in power amplifier 5 of FIG. 1) according to an exemplary embodiment of the present invention.

Referring to FIG. 4, the circuit protection unit 50 includes a fault discriminator 300 and a fault detector 320.

The fault discriminator 300 generates a fault discrimination signal for discriminating (e.g., pre-filtering) a fault, based on the amplifier output signal.

The fault detector 320 generates an active fault detection signal indicating the detection of the fault, based on a comparison between the fault discrimination signal and the first pulse width modulation signal.

Figure 5:
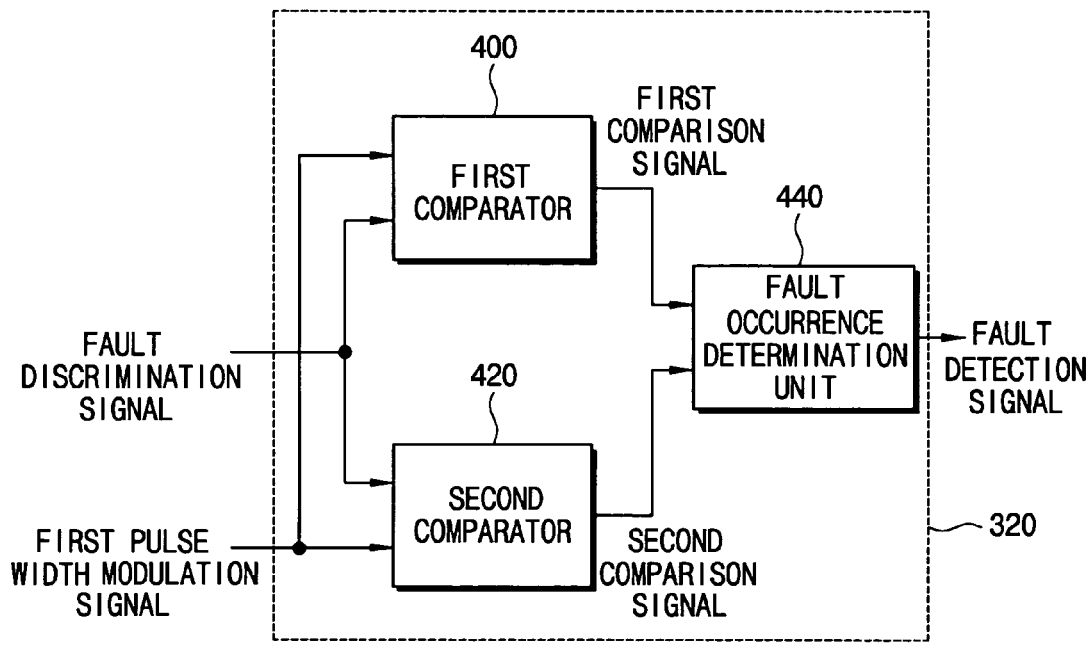
FIG. 5 is a block diagram illustrating a fault detector in the circuit protection unit of FIG. 4.

FIG. 5 is a block diagram illustrating a fault detector (e.g., in power amplifier 5 of FIG. 1) according to an exemplary embodiment of the present invention.

Referring to FIG. 5, the fault detector 320 includes a first comparator 400, a second comparator 420, and a fault occurrence determination unit 440.

The first comparator 400 generates a first comparison signal having information about a fault occurrence based on a comparison between the first pulse width modulation signal (being used as a first clock signal) and the fault discrimination signal.

The second comparator 420 generates a second comparison signal having information about a fault occurrence based on a comparison of the fault discrimination signal (being used as a second clock signal) and the first pulse width modulation signal.

The fault occurrence determination unit 440 generates the fault detection signal based on the first and second comparison signals. When a fault occurs, the fault occurrence determination unit 440 uses the fault detection signal as an alarm signal to inform the signal generator 10 (see FIG. 1) of the occurrence of the fault. Thus, when the fault occurs, the fault detection signal may have an active (e.g., high) logic level. Conversely, when the fault has not occurred, the fault detection signal may have an inactive (e.g., low) logic level.

Figure 6:
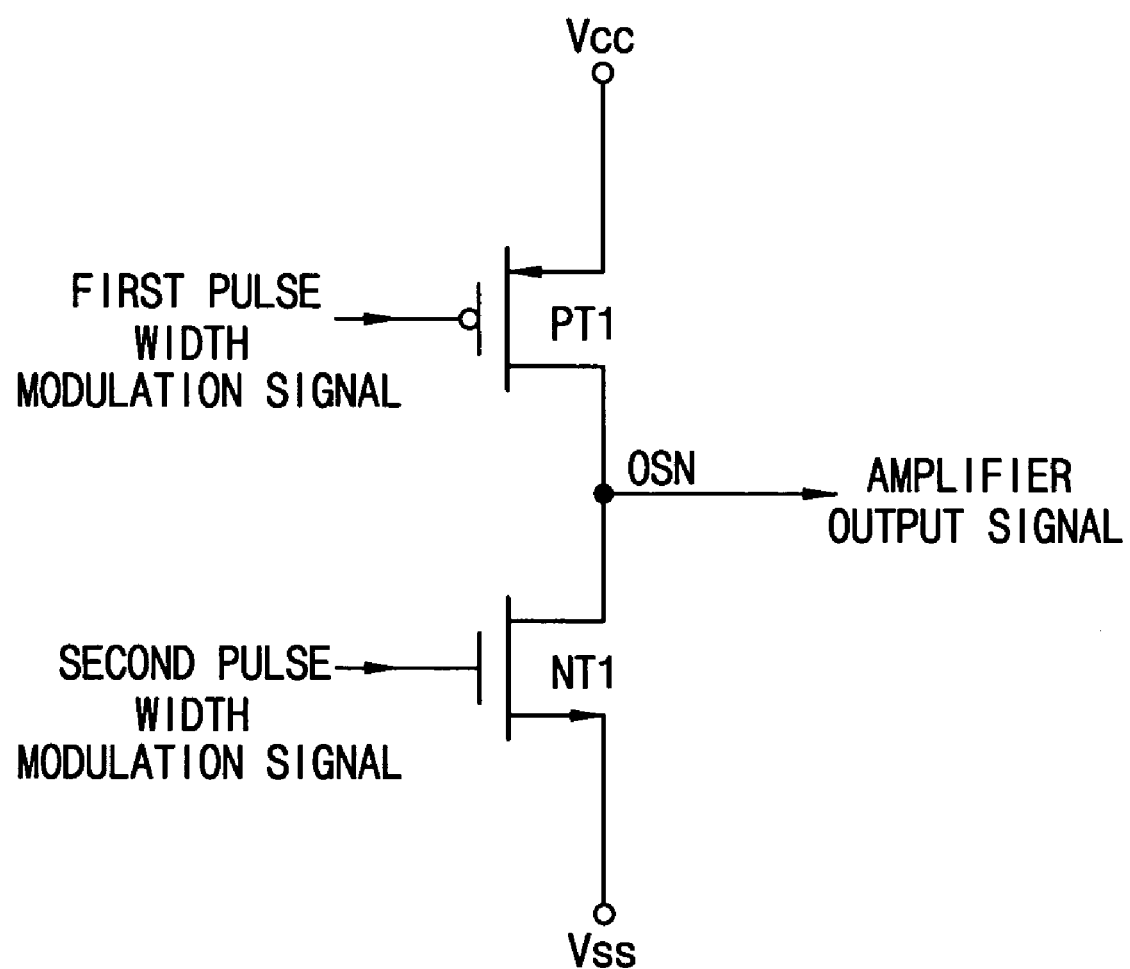
FIG. 6 is a circuit diagram illustrating an amplifier output unit in the amplifier of FIG. 1.

FIG. 6 is a circuit diagram illustrating an amplifier output unit (e.g., in the power amplifier 5 of FIG. 1) according to an exemplary embodiment of the present invention.

Referring to FIG. 6, the amplifier output unit 30 includes a P-type switch (e.g., PMOS transistor PT1) and an N-type switch (e.g., NMOS transistor NT1), wherein the P-type switch and the N-type switch are operatively coupled in series, between a supply voltage Vcc and ground Vss, at an output signal node OSN for outputting the amplifier output signal. The first pulse width modulation signal is input to a gate of the P-type switch (PMOS transistor PT1). Whereas, the second pulse width modulation signal is input to a gate of the N-type switch (NMOS transistor NT1).

The amplifier output unit 30 according to an exemplary embodiment of the present invention alternately activates the PMOS transistor PT1 and the NMOS transistor NP1. Particularly, when the PMOS transistor operates, the NMOS transistor is turned off. As a result, the amplifier output unit 30 effectively inverts the first pulse width modulation signal, to generate the amplifier output signal. Whereas, when the NMOS transistor operates, the PMOS transistor is turned off. As a result, the amplifier output unit 30 effectively inverts the second pulse width modulation signal, thereby generating the amplifier output signal. In other words, the amplifier output unit 30 functions as an inverting and switching circuit element.

FIGS. 7A through 7D are circuit diagrams illustrating details of the amplifier output unit (e.g., 30 in FIG. 1), coupled with alternative embodiments of a filtering unit and a speaker.

As shown in FIGS. 7A through 7D, a circuit including the amplifier output unit 30, the filtering unit 70 and the speaker 90 may have one of four general types of circuit construction.

Figure 7A:
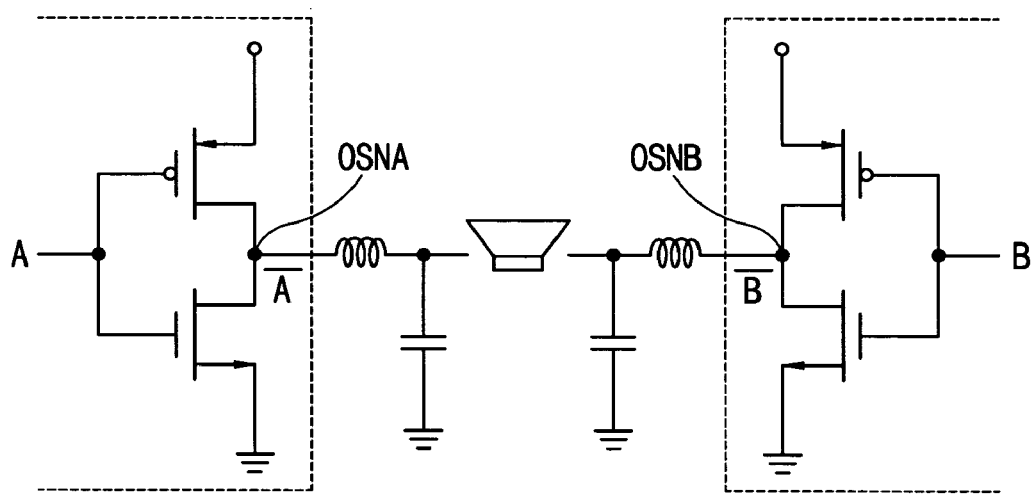
FIGS. 7A through 7D are circuit diagrams illustrating in detail an amplifier output unit, a filtering unit and a speaker for use with the amplifier of FIG. 1.
Figure 7B:
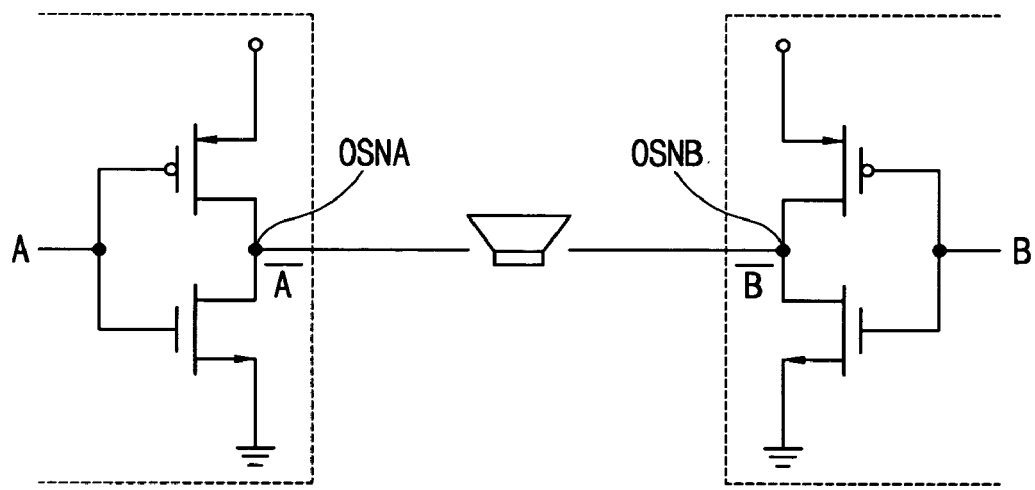
Figure 7C:
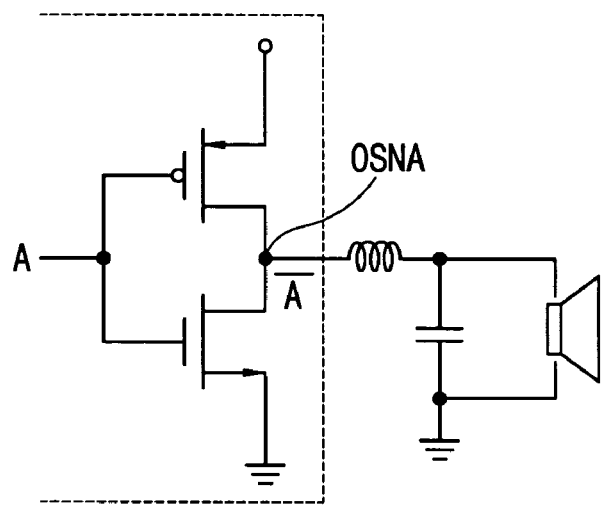
Figure 7D:
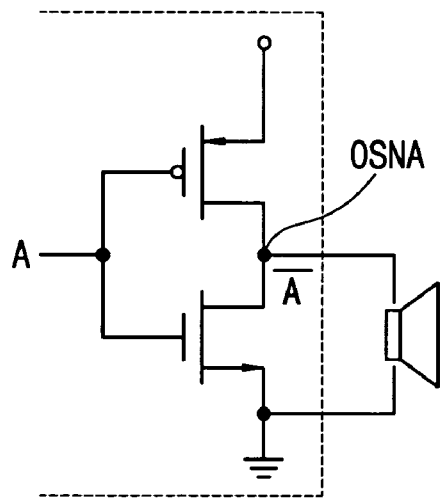

Referring to FIG. 7A, a first output signal node OSNA may be short-circuited, or a second output signal node OSNB may be short-circuited, to produce a fault.

Figure 8A:
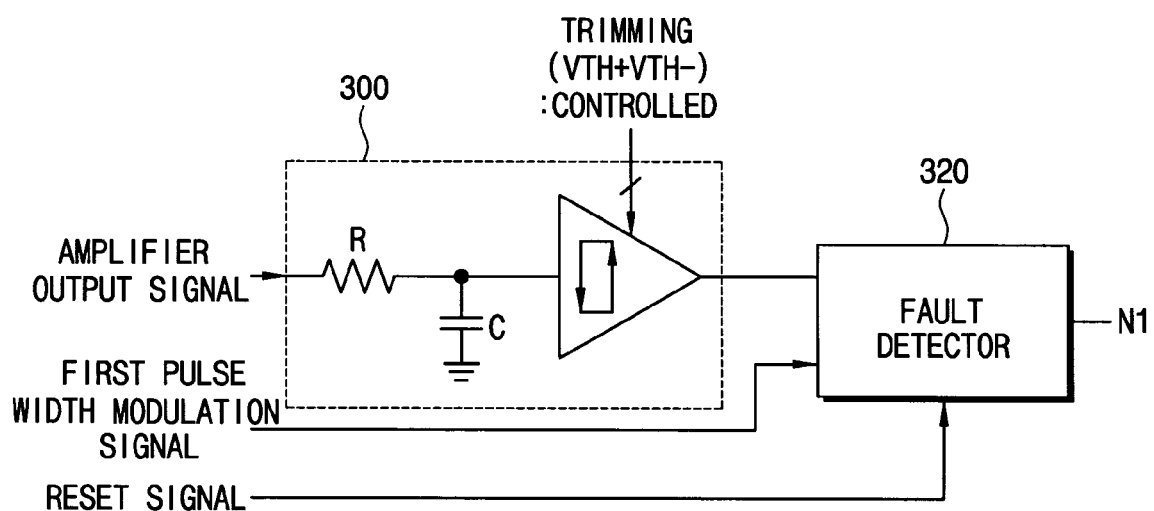
FIG. 8A is a schematic circuit diagram of a fault discriminator according to an exemplary embodiment of the present invention.

FIG. 8A is a schematic circuit diagram of a fault discriminator (e.g., 300 in circuit protection unit 50 of FIGS. 1 and 4) according to an exemplary embodiment of the present invention.

As shown in FIG. 8A, the fault discriminator 300 includes an RC filter (including a resistor R; a capacitor C connected to the resistor and to ground), and a Schmitt trigger coupled to the RC filter (to the R resistance and to the capacitor C). The capacitor and the resistance function as a low-pass filter. The externally controlled Schmitt trigger defines an upper threshold and a lower threshold (a voltage margin) selected depending on manufacturing processes, and converts the (low-pass filtered) amplifier output signal into the fault discrimination signal. Also, the Schmitt trigger inverts the (low-ass filtered) amplifier output signal. The upper and lower thresholds (margin) may be varied (trimming controlled) based on the voltage level of an external signal.

Figure 8B:
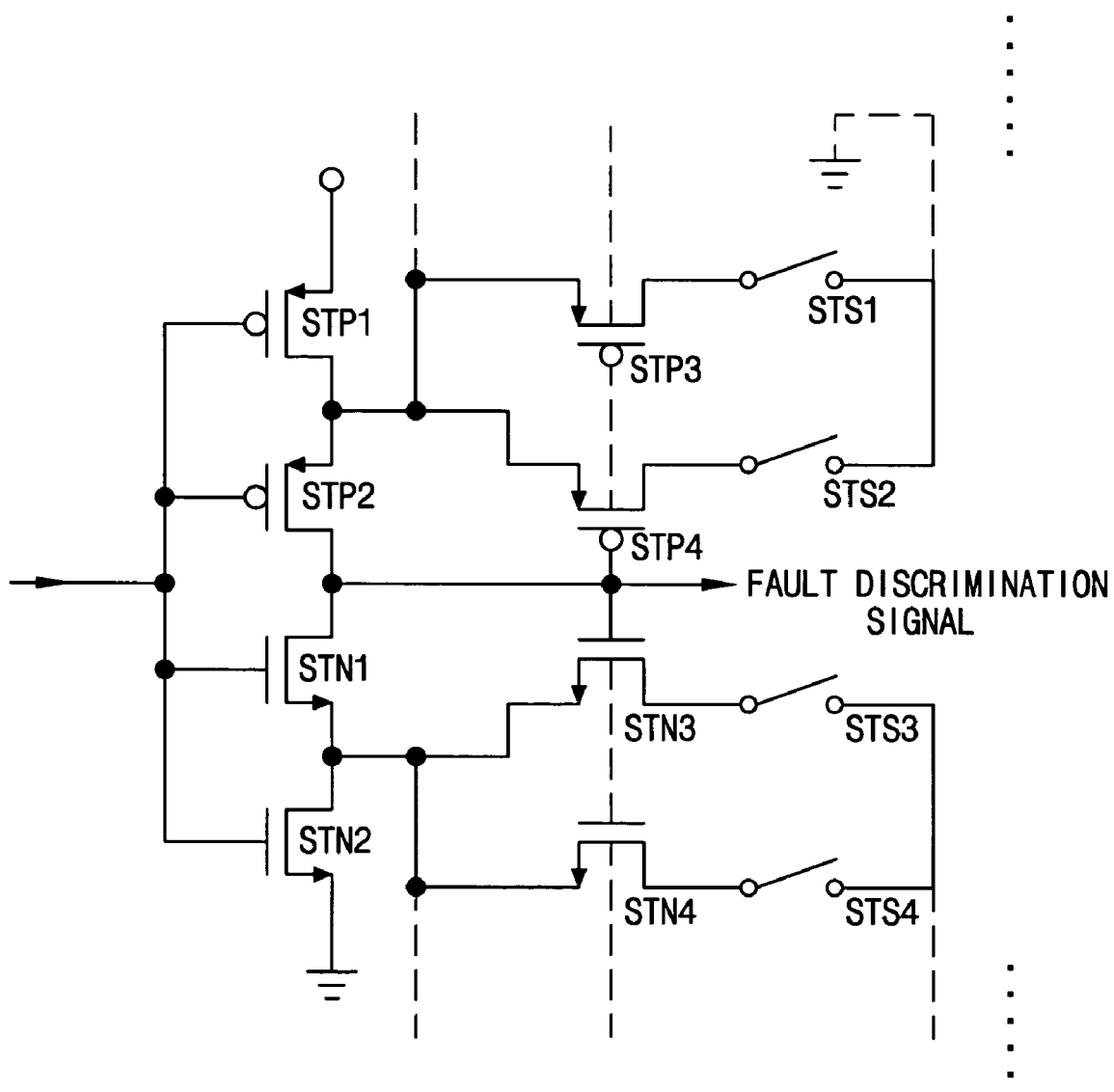
FIG. 8B is a circuit diagram illustrating a Schmitt trigger for use in fault discriminator of FIG. 8A.

FIG. 8B is a circuit diagram illustrating an exemplary externally controlled Schmitt trigger for use in a fault discriminator (e.g., 300 in FIG. 8A) according to an exemplary embodiment of the present invention.

Referring to FIG. 8B, the Schmitt trigger includes a plurality of P-type (e.g., PMOS) transistors (STP1, STP2, STP3, STP4) and a plurality of N-type (e.g., NMOS) transistors (STN1, STN2, STN3, STN4). The transistors are operatively coupled to a plurality of switches (STS1, STS2, STS3, STS4). A margin (between upper and lower thresholds) of the Schmitt trigger varies depending upon turning on and/or off of the switches (STS1, STS2, STS3, STS4). Thus, the switches may be used to increase or decrease the margin of the Schmitt trigger. During operation of the PMOS transistors (STP1, STP2, STP3, STP4), an output signal of the low-pass filter (see RC filter in FIG. 8A) having a low logic level is converted into the fault discrimination signal having a high logic level depending on the margin (e.g., lower threshold) of the Schmitt trigger. In addition, during operation of the NMOS transistors (STN1, STN2, STN3, STN4), the output signal of the low-pass filter having a high logic level is changed into the fault discrimination signal having a low logic level depending on the margin (e.g., upper threshold) of the Schmitt trigger.

Figure 9:
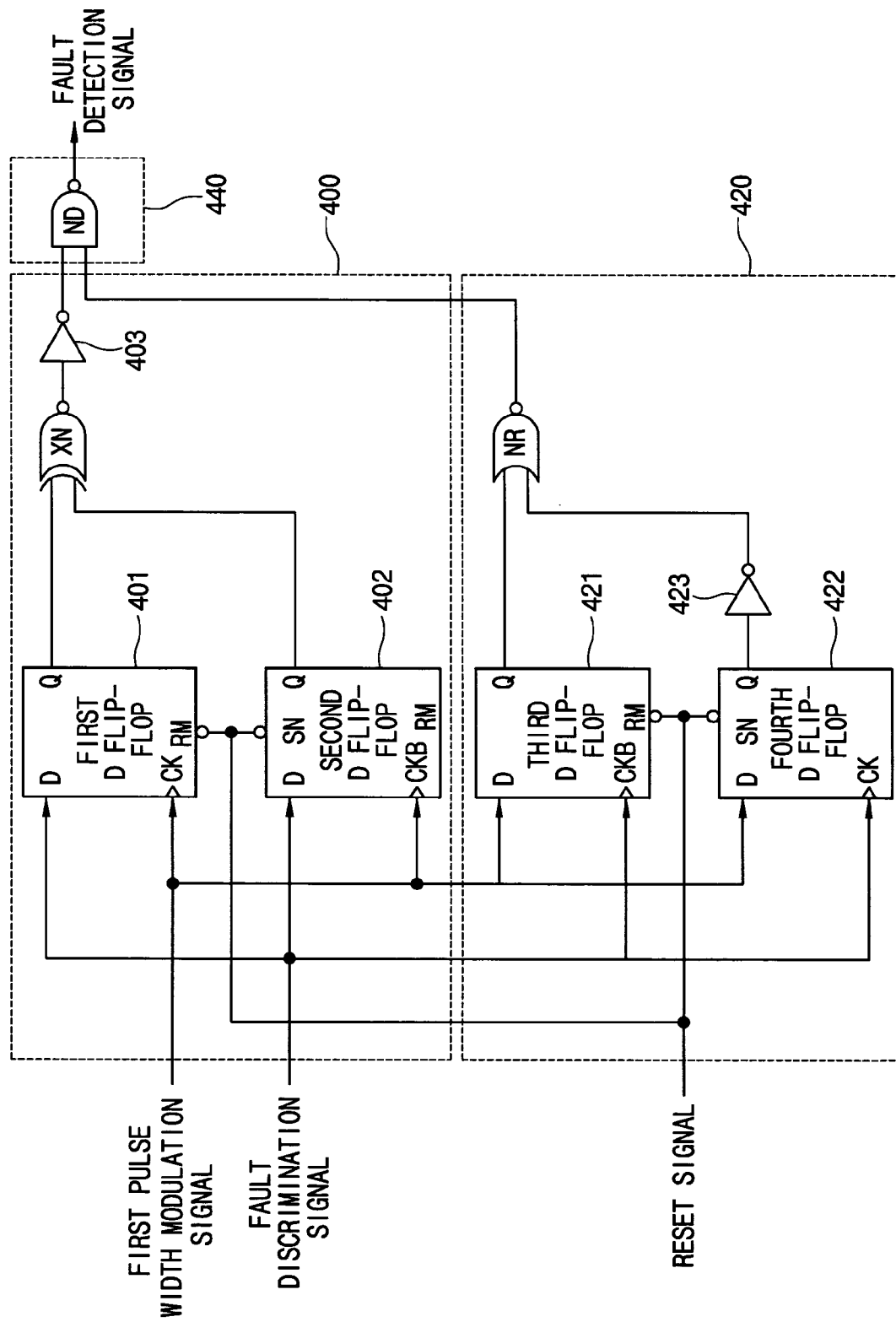
FIG. 9 is a schematic circuit diagram of a fault detector according to an exemplary embodiment of the present invention.

FIG. 9 is a schematic circuit diagram illustrating a fault detector (e.g., 320 of FIGS. 4 and 8A) according to an exemplary embodiment of the present invention. The fault detector (e.g., 320 of FIGS. 4, 5 and 8A) includes the first comparator 400 and the second comparator (see FIG. 5).

Referring to FIG. 9, the first comparator 400 includes a first latch (first D flip-flop 401), a second latch (second D flip-flop 402), a first logic gate (exclusive-NOR gate XN) and a first inverter 403. The second latch (second D flip-flop 401) is operatively coupled to the first D flip-flop 402 by a first common clock signal (the first pulse width modulation signal). The latched outputs of each of the first and second latches (from output terminal Q of each of D flip-flops 401 and 402) are inputs of the first logic gate (exclusive-NOR gate XN). The first inverter 403 inverts the output of the first logic gate (of exclusive NOR gate XN).

The second comparator 420 includes a third latch (D flip-flop 421), a fourth latch (D flip-flop 422), a second inverter 403 and a second logic gate (NOR gate NR). The fourth latch (D flip-flop 422) is operatively coupled to the third D flip-flop 421 by a second common clock signal (the fault discrimination signal). The second inverter 423 inverts the latched output (from an output terminal Q) of the fourth latch (D flip-flop 422). The latched output of the third latch (third D flip-flop 421) and the output of the second inverter 423 are inputs of the second logic gate (NOR gate NR).

The fault occurrence determination unit 440 (see FIG. 5) includes a third logic gate (NAND gate ND). The outputs of the first and second logic gates are inputs of the third logic gate.

The first pulse width modulation signal is input to clock terminals CK and CKB of the first and second latches (D flip-flops 401 and 402). However, the first pulse width modulation signal is input to the data input terminals "D" of each of the third latch (D flip-flop 421) and the fourth latch (D flip-flop 422).

The fault discrimination signal is input to data input terminals "D": of each of the first and second latches (D flip-flops 401 and 402). However, the fault discrimination signal is input to clock terminals CKB and CK of the third and fourth latches (D flip-lops 421 and 422).

Figure 10A:
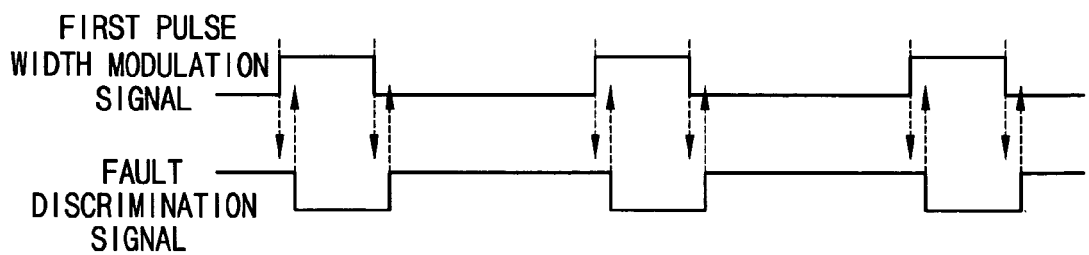
FIG. 10A is a timing diagram illustrating waveforms of a first pulse width modulation signal and a fault discrimination signal in the power amplifier of FIG. 1 operating normally.
Figure 10B:
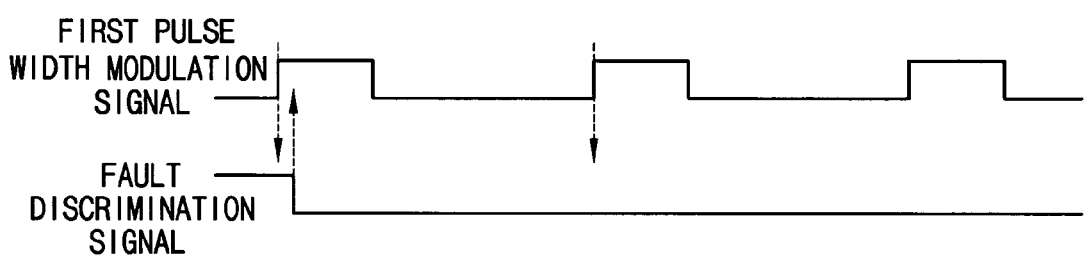
FIGS. 10B through 10E are timing diagrams illustrating waveforms of the first pulse width modulation signal and the fault discrimination signal in the power amplifier of FIG. 1 during a fault.
Figure 10C:
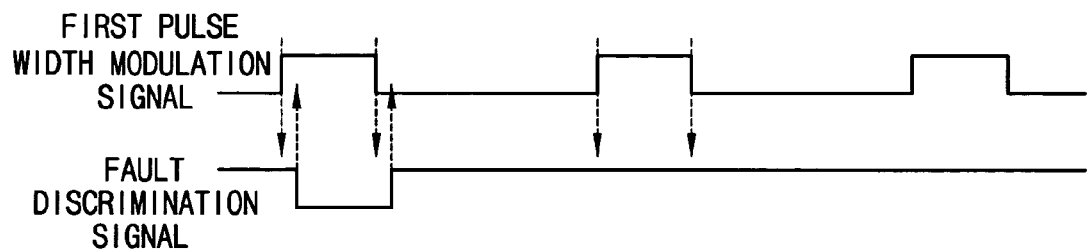
Figure 10D:
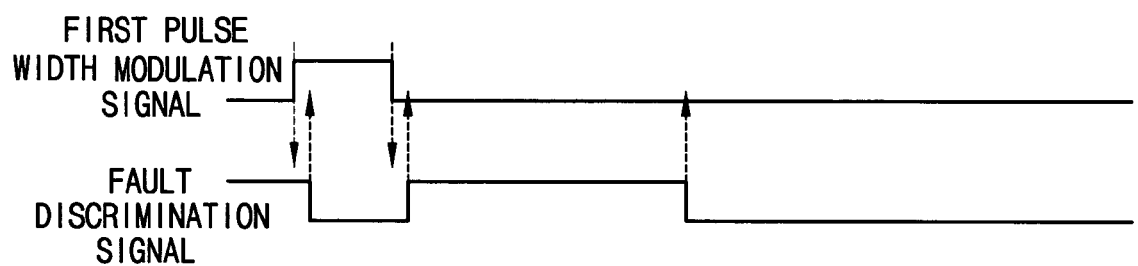
Figure 10E:
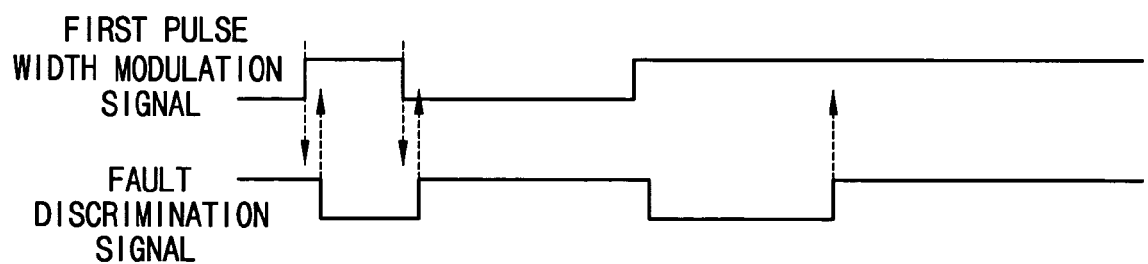

FIG. 10A is a timing diagram illustrating waveforms of the first pulse width modulation signal and of the fault discrimination signal during normal operation of a power amplifier (e.g., 5 of FIG. 1) according to an exemplary embodiment of the present. FIGS. 10B through 10E are timing diagrams illustrating the waveforms of the first pulse width modulation signal and of the fault discrimination signal when a fault occurs in the power amplifier (e.g., 5 of FIG. 1) according to an exemplary embodiment of the present invention.

Referring to FIGS. 10A through 10E, when a fault occurs in the power amplifier (e.g., 5 of FIG. 1), the waveform of the fault discrimination signal becomes detectably different from the waveform of the first pulse width modulation signal (compare to the similar waveforms in FIG. 10A). Thus, whether the fault is occurring is detected by comparing the first pulse width modulation signal with the fault discrimination signal.

Figure 11:
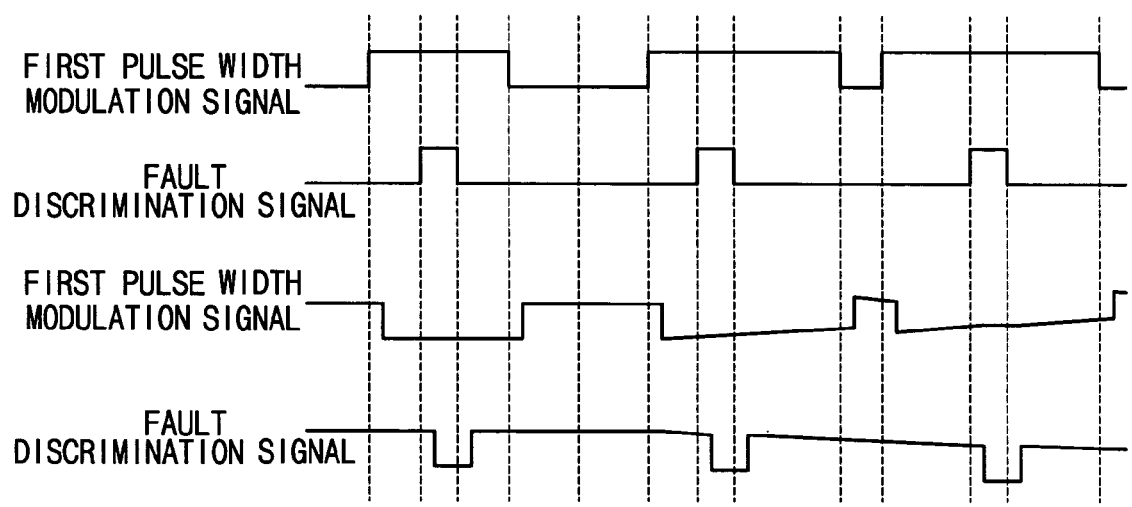
FIG. 11 is a timing diagram illustrating an output signal of the power amplifier of FIG. 1 when a second output node of FIG. 7A is shorted.

FIG. 11 is a timing diagram illustrating waveforms of an amplifier output signal when the second output signal node OSNB of FIG. 7A is short-circuited.

Referring to FIG. 11, when the second output signal node OSNB of FIG. 7A is short-circuited (e.g., to ground or to a supply voltage), the amplifier output signal becomes distorted. For example, a voltage level of the amplifier output signal increases or decreases over time. When the resulting (distorted) amplifier output signal passes through the Schmitt trigger (in the fault discriminator 300 of the circuit protection unit 50; see FIGS. 8A and 8B), the fault discrimination signal corresponding to the amplifier output signal may resemble (have the topology of) one of the fault discrimination signals of FIGS. 10B through 10E. When a level of the distorted amplifier output signal exceeds a threshold (the margin range) of the Schmitt trigger, the Schmitt trigger applies its hysteresis characteristics. For example, when the distorted amplifier output signal having a low logic level increases with an increase in time to exceed an upper threshold of the Schmitt trigger, the low logic level of the amplifier output signal is output as a fault discrimination signal having a high logic level. Whereas, when the distorted amplifier output signal having a high logic level decreases below a lower threshold of the Schmitt trigger with an increase in time, the high logic level of the amplifier output signal is output as a fault discrimination signal having a low logic level.

Figure 12A:
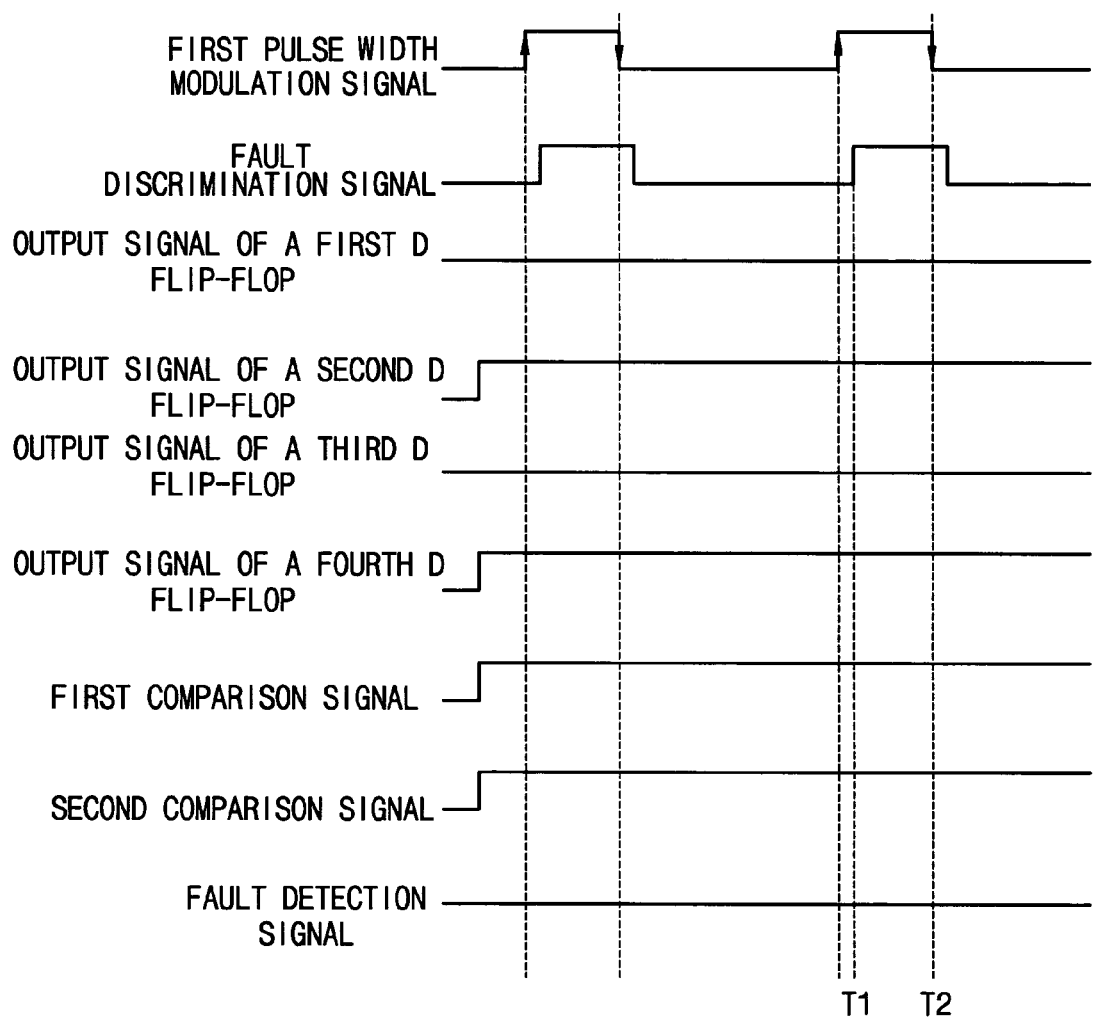
FIG. 12A is a timing diagram illustrating waveforms of signals through the fault detector when the power amplifier of FIG. 1 operates normally.
Figure 12B:
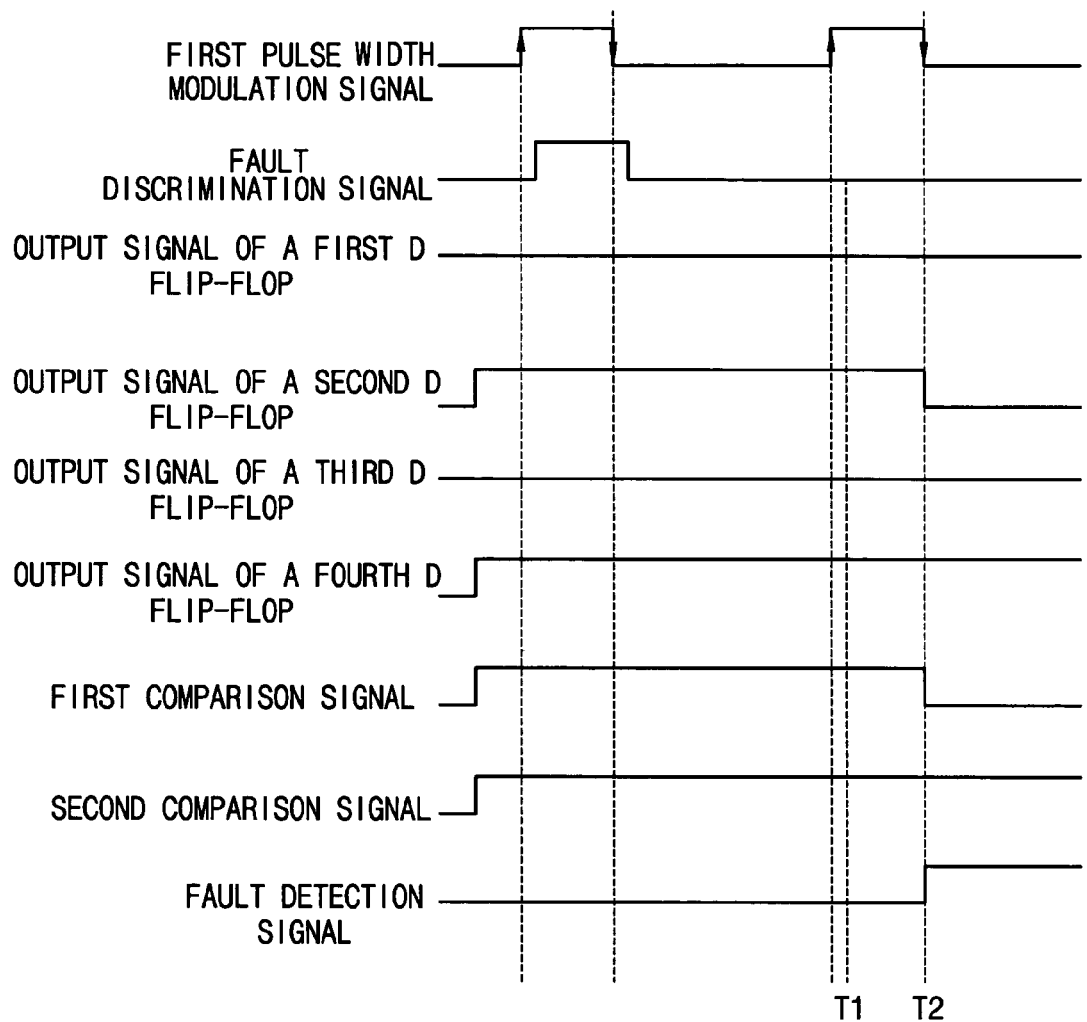
FIG. 12B is a timing diagram illustrating waveforms of signals through the fault detector when fault occurs in the power amplifier of FIG. 1 n.

FIG. 12A is a timing diagram illustrating waveforms of signals within and through the fault detector 320 (see FIGS. 4, 5 and 8A) when a power amplifier (e.g., 5 of FIG. 4) according to an exemplary embodiment of the present invention operates normally. FIG. 12B is a view illustrating waveforms of signals within and through the fault detector 320 (see FIGS. 4, 5 and 8A) when a fault occurs in the power amplifier (e.g., 5 of FIG. 4). Hereinafter, operation of a power amplifier (e.g., 5 of FIG. 4) according to an exemplary embodiment of the present invention will be described with reference to the circuit of FIG. 9.

When the FIG. 12A is compared with the FIG. 12B, it can be understood that the fault is generated between a first time T1 and a second time T2. Therefore, the fault is detectable at time T2.

Referring to FIG. 12A, output signals of the first and third latches (D flip-flops 401 and 421) have low logic levels during normal operation (when a fault is not detected). Meanwhile, the output signals of the second and fourth latches (D flip-flops 402 and 422) have high logic levels during normal operation. As a result, the fault detection signal has an inactive (low) logic level. Thus, when the inactive fault detection signal having the inactive logic level is generated, it is determined that a fault is not occurring.

Referring to FIG. 12B, when the fault occurs, output signals of the first and third latches (D flip-flops 401 and 421) have low logic levels. However, an output signal of the second latch (D flip-flop 402) has a high logic level before T2, and then has a low logic level after T2. Additionally, an output signal of the fourth latch (D flip-flop 422) has a high logic level. As a result, the logic level of the fault detection signal is changed from a low logic level into an active (high) logic level at T2. Thus, when the fault detection signal having the active logic level is generated, the fault detection circuit of the present invention indicates that the fault is occurring.

When a fault is detected, the signal generator 10 (see FIG. 1) generates the first pulse width modulation signal having a first (high) logic level and the second pulse width modulation signal having a second (low) logic level. As a result, the PMOS transistor PT1 and the NMOS transistor NT1 of the amplifier output unit 30 (see FIG. 6) are both turned off. After the fault occurrence is detected, and after an elapse of a predetermined time following the detected fault the reset signal is generated. As a result, the circuit protection unit 50 may detect another fault occurrence. When a fault is not detected, the power amplifier 5 may operate normally. Thus, the PMOS transistor PT1 and the NMOS transistor NT1 (of the amplifier output unit 30; see FIG. 6) are alternately turned on according to the received audio signal.

Figure 12C:
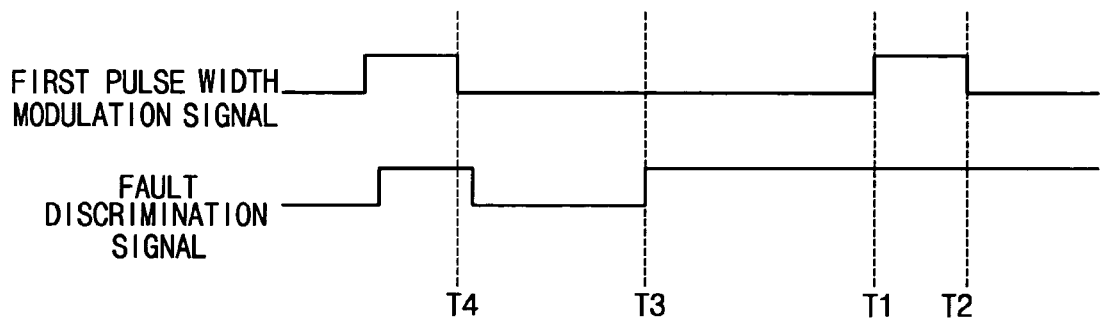
FIG. 12C is a timing diagram illustrating a fault occurrence in the power amplifier of FIG. 1.

FIG. 12C is a timing diagram illustrating waveforms during a fault occurrence in a power amplifier 5 according to an exemplary embodiment of the present invention.

Referring to FIGS. 9 and 12C, the fault is detected at time T3. In FIG. 9, when only the first pulse width modulation signal is operated as the clock signal of latches, the fault detection circuit and the fault detection power amplifier of the present invention detects the fault at time T1. When the time difference between the T1 and T4 is large, a reliable protection of the circuit may not be assured. Therefore, the fault detection circuit and the fault detection power amplifier of the present invention use each of the first pulse width modulation signal and the fault discrimination signal (alternatively) as the clock signal to latches in comparators of the fault detector 320. Thus, the fault detection circuit (and the power amplifier 5) of the present invention use the first pulse width modulation signal as a clock signal to compare the first pulse width modulation signal with the fault discrimination signal; and, the fault detection circuit (and the power amplifier 5) of the present invention use the fault discrimination signal as the clock signal to compare the fault discrimination signal with the first pulse width modulation signal. As a result, the fault occurrence is reliably detected at time T3. Hence, a power amplifier made in accordance with an embodiment of the present invention may be reliably protected.

Figure 13:
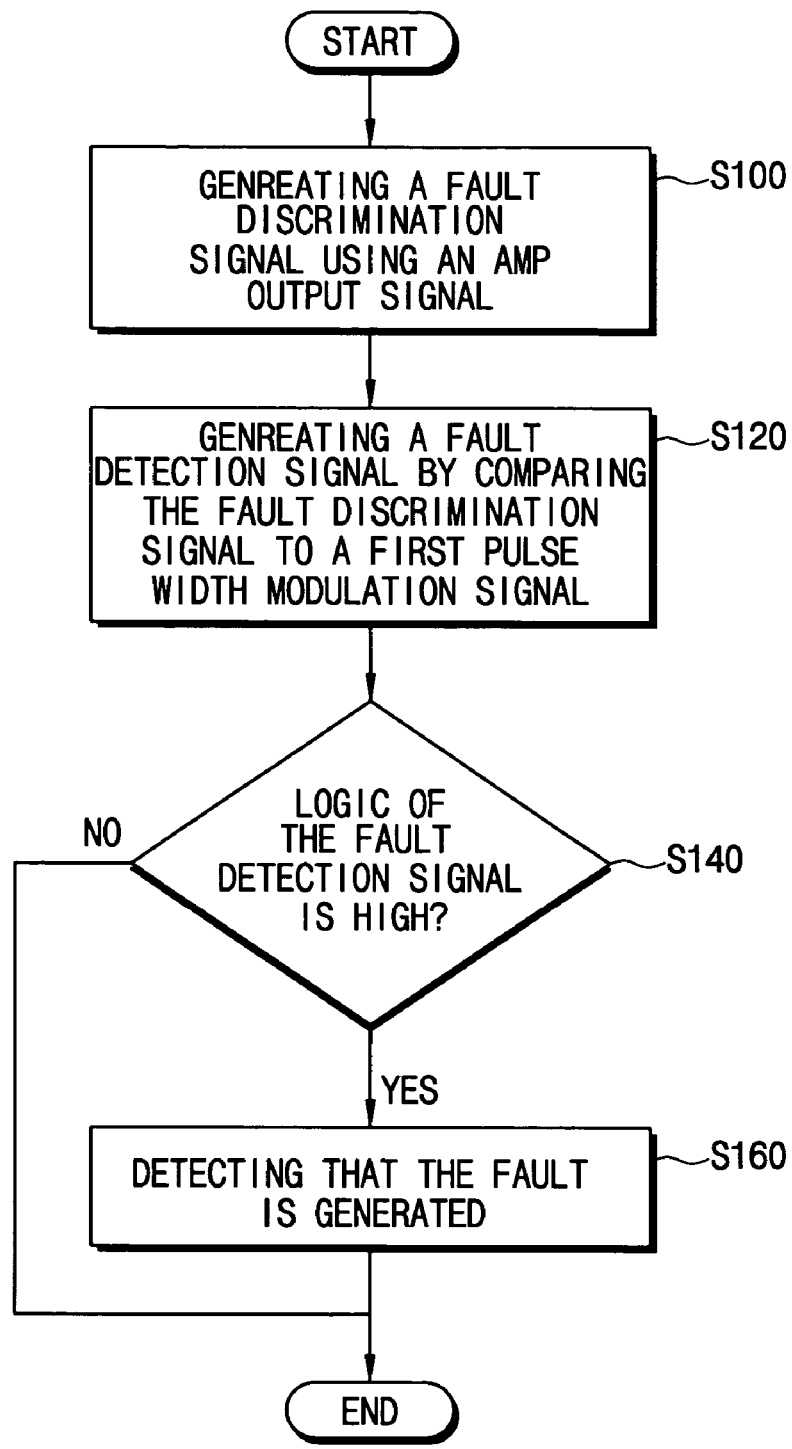
FIG. 13 is a flowchart illustrating a method of detecting a fault according to an exemplary embodiment of the present invention.

FIG. 13 is a flowchart illustrating a method of detecting a fault according to an exemplary embodiment of the present invention.

Referring to FIG. 13, the fault discriminator 300 (see FIG. 4) generates the fault discrimination signal using the amplifier output signal (step S100). And the fault detector 320 compares the fault discrimination signal with the first pulse width modulation signal, to generate the fault detection signal (step S120). And then, it is discriminated whether logic level of the fault detection signal is active (high) (step S140). When the fault detection signal has an active logic level, the power amplifier is detecting that a fault is occurring (step S160).

Figure 14:
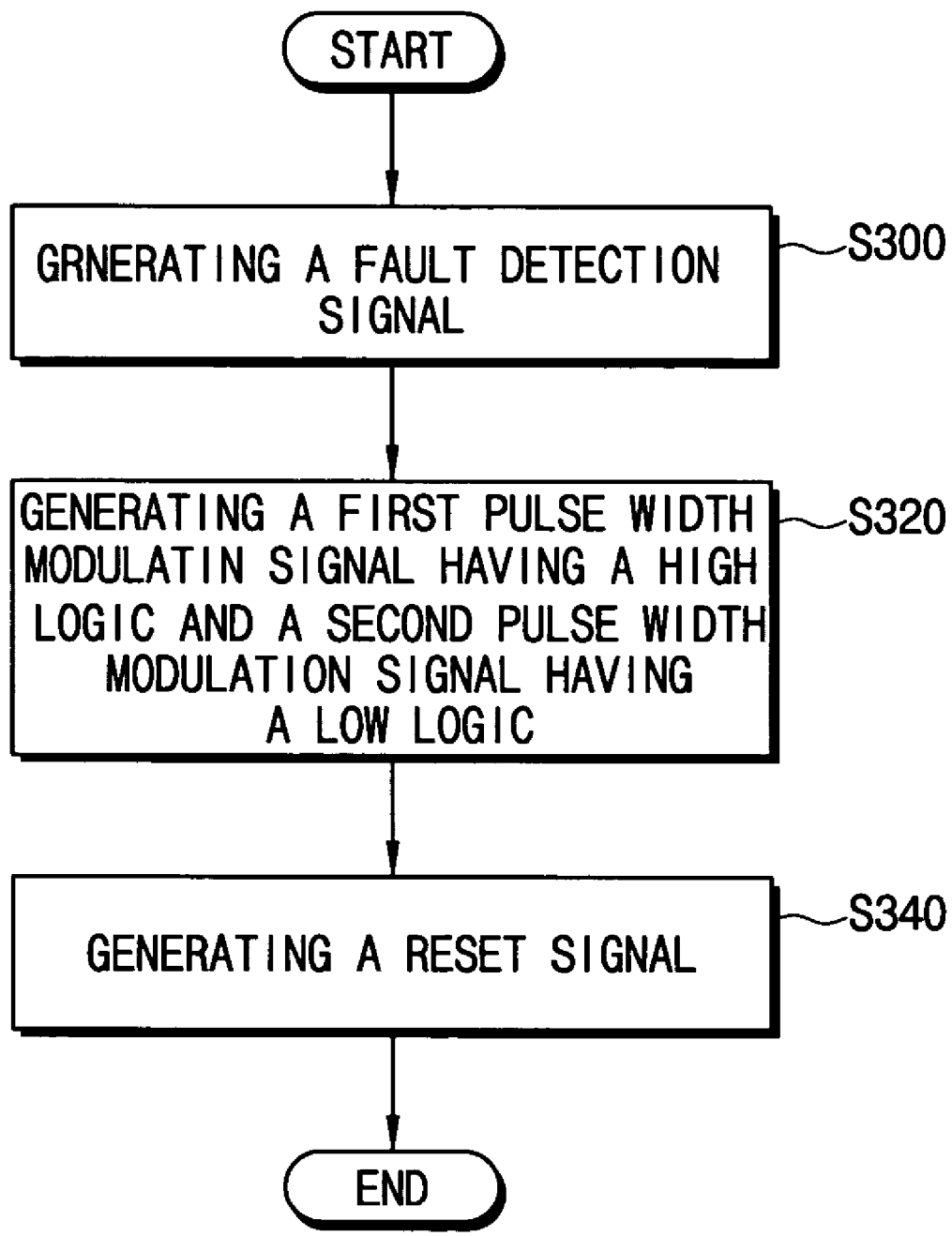
FIG. 14 is a flowchart illustrating a method of operation of a power amplifier when fault is detected according to an exemplary embodiment of the present invention.

FIG. 14 is a flowchart illustrating a method of operation of a power amplifier when a fault is detected, according to an exemplary embodiment of the present invention.

Referring to FIG. 14, the circuit protection unit 50 generates the fault detection signal having an active (high) logic level (step S300).

When the signal generator 10 receives the fault detection signal having an active logic level, the signal generator 10 generates the first pulse width modulation signal having a first (high) logic level and the second pulse width modulation signal having a second (low) logic level (step S320).

After a fault has been detected, the signal generator 10 generates the reset signal after an elapse of the predetermined time following the time of detection of the fault (step S340).

As discussed above, the present invention includes a method of detecting the fault, a circuit configured to perform that method, a method of protecting a power amplifier against the fault, and a power amplifier configured to detect a fault. Thus, the present invention provides the capability of directly detecting the occurrence of a fault because by comparing the first pulse width modulation signal and the amplifier output signal (using a Schmitt trigger and the fault detector).

Also, the present invention provides a method of protecting a power amplifier against a fault and further provides a power amplifier configured to detect a fault and capable of operating stably because the occurrence of the fault is directly detected to turn-off the output switches (PMOS and NMOS transistors of the amplifier output unit).

Having thus described exemplary embodiments of the present invention, it is to be understood that the invention defined by the appended claims is not to be limited by particular details set forth in the above description of exemplary embodiments as many apparent variations thereof are possible without departing from the spirit or scope of the invention as hereafter claimed.

What is claimed is:

1. A method of detecting a fault comprising:
generating a pulse width modulation signal corresponding to received digital data;
generating an amplifier output signal based upon the pulse width modulation signal;
generating a first comparison signal based on a first comparison between the pulse width modulation signal and the amplifier output signal;
generating a second comparison signal based on a second comparison between the pulse width modulation signal and the amplifier output signal; and
generating a fault detection signal, for indicating the fault, based on a comparison between the first comparison signal and the second comparison signal.

2. The method of claim 1, wherein generating the first comparison signal includes:
sampling and holding the amplifier output signal using the pulse width modulation signal as a first sampling clock signal, to generate the first comparison signal; and
wherein generating a second comparison signal includes:
sampling and holding the pulse width modulation signal using the amplifier output signal as a second sampling clock signal, to generate the second comparison signal.

3. The method of claim 1, wherein a logic level of the fault detection signal corresponds to an active state when the fault is detected.

4. The method of claim 1, wherein the generating an amplifier output signal includes inverting the pulse width modulation signal.

5. A method of detecting a fault in a class D amplifier, the method comprising:
receiving a pulse width modulation signal that is applied to a gate of an output switch of the class D amplifier;
receiving an output signal outputted to a load by the output switch of the class D amplifier;
detecting an abnormal non-variation of the output signal based on a comparison between the pulse width modulation signal and the output signal;
generating an fault detection signal when the abnormal non-variation state is detected.

6. The method of claim 5, further comprising:
detecting an abnormal variation of the output signal based on a comparison between the pulse width modulation signal and the output signal; and
generating the fault detection signal when the abnormal variation state is detected.

7. The method of claim 5, further comprising:
filtering the output signal through a low pass filter; and
hysteretic filtering the low pass filtered output signal to generate a waveform.

8. The method of claim 6, wherein the hysteretic filtering is Schmitt-triggering.

9. The method of claim 8, wherein the Schmitt-triggering includes programming an upper threshold of the Schmitt-triggering and a lower threshold thereof.

10. A method of protecting a power amplifier circuit, the method comprising:
generating an amplifier output signal based on a pulse width modulation signal corresponding to audio data;
generating a fault detection signal upon detecting a fault by comparing the pulse width modulation signal with the amplifier output signal; and
generating a protection signal, based on the fault detection signal, for protecting the power amplifier circuit.

11. The method of claim 10, wherein the generating an amplifier output signal includes inverting the pulse width modulation signal.

12. The method of claim 10, wherein a logic level of the fault detection signal corresponds to an active level when the fault is detected.

13. A method of protecting a power amplifier circuit comprising:
generating an amplifier output signal based on a first pulse width modulation signal and a second pulse width modulation signal, the first and second pulse width modulation signals both having pulse widths modulated corresponding to an audio data signal during normal operation of the power amplifier circuit;

generating a fault detection signal, for detecting a fault, based on a comparison of the first pulse width modulation signal With the amplifier output signal; and generating the first and second pulse width modulation signals for protecting the power amplifier circuit based on the fault detection signal.

14. The method of claim 13, wherein the generating a fault detection signal includes inverting the amplifier output signal.

15. The method of claim 14, wherein the generating a fault detection signal includes:

latching the amplifier output signal using the pulse width modulation signal as a first latching clock signal to generate a first comparison signal having information about an occurrence of the fault; and latching the first pulse width modulation signal using the amplifier output signal as a second latching clock signal to generate a second comparison signal having information about the occurrence of the fault.

16. The method of claim 13, wherein a logic level of the fault detection signal corresponds to an active state when the fault is detected.

17. The method of claim 16, wherein the generating the first and second pulse width modulation signals includes generating the first pulse width modulation signal that corresponds to the active state and the second pulse width modulation signal that corresponds to a non-active state, when the fault is detected.

18. The method of claim 13, wherein the first pulse width modulation signal and the second pulse width modulation signal are same signals in the absence of a fault.

19. The method of claim 13, further comprising generating a reset signal for driving the circuit after elapse of a predetermined time following a detection of a fault.

20. A circuit for detecting an abnormal state in a class D power amplifier comprising:

a first input terminal for receiving a pulse width modulation signal that is applied to a gate of an output switch of the class D power amplifier;

a second input terminal for receiving an output signal outputted to a load by the output switch;

a first detector for comparing the pulse width modulation signal with the output signal to detect an abnormal non-variation state of the output signal;

a second detector for comparing the pulse width modulation signal with the output signal to detect an abnormal variation of the output signal; and a detection signal generator configured to generate an fault detection signal when either one of the abnormal non-variation state or abnormal variation state is detected.

21. The circuit of claim 20, further comprising:

a low pass filter for eliminating high frequency noise components from the output signal to be input to the second input terminal; and a waveform shaping unit for performing a hysteretic filtering of the low-pass filtered output signal to generate a waveform to be provided to the first and second detectors.

22. A circuit for detecting a fault comprising:

a fault discriminator configured to generate a filtered output signal by filtering an output signal; and a fault detector configured to generate a fault detection signal by comparing a pulse width modulation signal corresponding to digital data with the filtered output signal.

23. The circuit of claim 22, wherein the fault detector includes:

a first comparator configured to generate a first comparison signal having information about a fault occurrence by sampling the filtered output signal using a first pulse width modulation signal as a first sampling clock signal;

a second comparator configured to generate a second comparison signal having information about the fault occurrence by sampling the first pulse width modulation signal using the filtered output signal as a second sampling clock signal; and a fault occurrence determination unit configured to generate the fault detection signal based on comparing the first and second comparison signals.

24. The circuit of claim 23, wherein the first comparator includes:

a first latch for sampling and holding the filtered output signal;

a second latch for sampling and holding the filtered output signal;

an XNOR gate having the latched outputs of first and second flip-flops as its inputs.

25. The circuit of claim 24, wherein the second comparator includes:

a third for sampling and holding the first pulse width modulation signal;

a fourth latch for sampling and holding the first pulse width modulation signal;

a second inverter for inverting the latched output of the fourth latch; and a NOR gate having the latched output of the third latch and the output of the second inverter as its inputs.

26. The circuit of claim 25, wherein the fault occurrence determination unit includes a NAND gate having the first comparison signal and the second comparison signal as its inputs.

27. The circuit of claim 22, wherein the fault discriminator includes:

a low-pass filter for eliminating a noise component from the amplifier output signal; and a Schmitt trigger for hysteretically filtering the low-pass filtered amplifier output signal.

28. The circuit of claim 22, wherein when the fault occurs, the fault detection signal corresponds to a high logic level.

29. A class D amplifier comprising:

a first output switch connected between a first voltage and an output terminal, and controlled by a first pulse width modulation signal;

a second output switch connected between the output terminal and a second voltage, and controlled by a second pulse width modulation signal;

a circuit, for detecting an abnormal state in the output signal of the output terminal and for generating an abnormal state detection signal, configured to receive the first pulse width modulation signal and an output signal of the output terminal; and a pulse width modulation signal generator, for generating the first and second pulse width modulation signals in a normal mode, and configured to turn off the first and second output switches when the abnormal state detection signal is generated by the circuit for detecting an abnormal state.

30. A power amplifier comprising:
a signal generator configured to receive audio data signal and to pulse width modulate the audio signal, thereby generating a pulse width modulation signal corresponding to the audio data signal, and to generate a protection signal for protecting a circuit in response to a received fault detection signal indicating the occurrence of a fault;
an amplifier output unit configured to generate an amplifier output signal for driving a load; and
a circuit protection unit configured to compare the pulse width modulation signal with the amplifier output signal to generate the fault detection signal.

31. The power amplifier of claim 30, wherein the circuit protection unit includes:
a fault discriminator configured to generate a fault discrimination signal based on the amplifier output signal; and
a fault detector configured to generate the fault detection signal based on comparing the pulse width modulation signal and the fault discrimination signal.

32. A power amplifier comprising:
a signal generator configured to modulate an audio data signal to generate a first pulse width modulation signal and a second pulse width modulation signal, and configured to protect a circuit from a fault indicated by a fault detection signal;
an amplifier output unit configured to use the first and second pulse width modulation signals to generate an amplifier output signal for driving a load; and
a circuit protection unit configured to generate the fault detection signal for indicating a fault by comparing the amplifier output signal with the first pulse width modulation signal.

33. The power amplifier of claim 32, wherein the signal generator includes a pulse width modulator configured to generate the first pulse width modulation signal and the second pulse width modulation signal by pulse width modulating the audio data signal.

34. The power amplifier of claim 33, wherein the signal generator further includes a reset unit configured to generate a reset signal for resetting the circuit protection unit.

35. The power amplifier of claim 32, wherein the amplifier output unit includes:
a first inverting unit configured to invert the first pulse width modulation signal; and
a second inverting unit configured to invert the second pulse width modulation signal.

36. The power amplifier of claim 35, wherein the first inverting unit includes a PMOS transistor.

37. The power amplifier of claim 36, wherein the second inverting unit includes an NMOS transistor.

38. The power amplifier of claim 32, wherein the circuit protection unit includes:
a fault discriminator configured to generate a fault discrimination signal based on the amplifier output signal; and
a fault detector configured to generate the fault detection signal by comparing the first pulse width modulation signal with the fault discrimination signal.

39. The power amplifier of claim 32, wherein the first pulse width modulation signal and the second pulse width modulation signal are same in the absence of a fault.

40. The power amplifier of claim 32, wherein when the first protection signal corresponds to an active state, the second protection signal corresponds to a non-active state.

* * * * *